(12) United States Patent
Tran et al.

(10) Patent No.: US 11,289,142 B2
(45) Date of Patent: Mar. 29, 2022

(54) NONVOLATILE MEMORY SENSING CIRCUIT INCLUDING VARIABLE CURRENT SOURCE

(71) Applicant: Avalanche Technology, Inc., Fremont, CA (US)

(72) Inventors: Thinh Tran, Palo Alto, CA (US); Ebrahim Abedifard, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 17/064,880

(22) Filed: Oct. 7, 2020

(65) Prior Publication Data

US 2022/0068341 A1   Mar. 3, 2022

Related U.S. Application Data

(63) Continuation-in-part of application No. 17/031,542, filed on Sep. 24, 2020.

(60) Provisional application No. 63/073,370, filed on Sep. 1, 2020.

(51) Int. Cl.
  *G11C 11/16* (2006.01)
  *G11C 13/00* (2006.01)

(52) U.S. Cl.
  CPC .. *G11C 11/1673* (2013.01); *G11C 2013/0054* (2013.01)

(58) Field of Classification Search
  None
  See application file for complete search history.

(56) References Cited

U.S. PATENT DOCUMENTS

| | | | |
|---|---|---|---|
| 8,213,215 B2 | 7/2012 | Chen et al. | |
| 9,384,791 B1 | 7/2016 | Chan et al. | |
| 9,437,257 B2 | 9/2016 | Yang et al. | |
| 10,311,919 B2 | 6/2019 | Schippers | |
| 10,453,532 B1 | 10/2019 | Antonyan | |
| 10,622,066 B2 | 4/2020 | Antonyan | |
| 2003/0103402 A1* | 6/2003 | Tran | G11C 11/16 365/211 |
| 2004/0085122 A1* | 5/2004 | Perner | H03F 3/45475 327/544 |
| 2005/0083747 A1* | 4/2005 | Tang | G11C 5/147 365/210.1 |
| 2008/0310236 A1* | 12/2008 | Baker | G11C 5/147 365/185.21 |

(Continued)

*Primary Examiner* — J. H. Hur
(74) *Attorney, Agent, or Firm* — Bing K. Yen

(57) ABSTRACT

The present invention is directed to a nonvolatile memory device including a plurality of memory slices, each memory slice including one or more memory sectors and a read circuit for sensing the resistance state of a magnetic memory cell in the memory sectors. The read circuit includes a first input node through which a reference current passes; a second input node through which a read current from the memory sectors passes; a sense amplifier configured to compare input voltages and having first and second input terminals; a reference resistor connected to the first input node at one end and the first input terminal at the other end; a variable current source connected to the reference resistor at one end and ground at the other end; and a second current source connected to the second input node at one end and ground at the other end.

13 Claims, 12 Drawing Sheets

(56) References Cited

U.S. PATENT DOCUMENTS

| | | |
|---|---|---|
| 2010/0073069 A1 | 3/2010 | Wang et al. |
| 2019/0043590 A1 | 2/2019 | Besinga et al. |
| 2019/0088322 A1* | 3/2019 | Pyo .................... G11C 11/1673 |
| 2019/0295621 A1* | 9/2019 | Ikegami .................. H01L 43/02 |
| 2019/0348096 A1 | 11/2019 | Antonyan et al. |
| 2020/0090724 A1 | 3/2020 | Antonyan et al. |
| 2020/0194068 A1 | 6/2020 | Antonyan |

* cited by examiner

NONVOLATILE MEMORY SENSING CIRCUIT INCLUDING VARIABLE CURRENT SOURCE

CROSS-REFERENCE TO RELATED APPLICATIONS

The present application is a continuation-in-part of application Ser. No. 17/031,542, filed on Sep. 24, 2020, which claims priority to provisional application No. 63/073,370, filed on Sep. 1, 2020. All of these applications are incorporated herein by reference in their entirety, including their specifications.

BACKGROUND

The present invention relates to a nonvolatile memory, and more particularly, to embodiments of sensing circuitry for the nonvolatile memory and method for using the same.

A resistance-switching memory device normally comprises an array of memory cells, each of which includes a memory element and a selection element, such as access transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

FIG. 1 is a schematic circuit diagram for a conventional memory array 20, which comprises a plurality of memory cells 22 arranged in rows and columns with each of the memory cells 22 including an access transistor 24 coupled to a resistance-switching memory element 26; a plurality of parallel word lines 28 with each being coupled to the gates of a respective row of the access transistors 24 in a first direction; a plurality of parallel bit lines 30 with each being coupled to a respective column of the memory elements 26 in a second direction substantially perpendicular to the first direction; and a plurality of parallel source lines 32 with each being coupled to a respective row or column of the access transistors 24 in the first or second direction.

The resistance-switching memory element 26 may be classified into at least one of several known groups based on their resistance-switching mechanisms. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal-rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage.

The memory element of Magnetic Random Access Memory (MRAM) normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current to the MTJ, the magnetization direction of the magnetic free layer can be switched between two configurations: parallel (i.e., same direction) and antiparallel (i.e., opposite direction) with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and antiparallel configurations with respect to the magnetization direction of the reference layer. Therefore, the two stable resistance states enable the MTJ to serve as a nonvolatile memory element.

MRAM devices have almost unlimited read/write endurance but relatively smaller sensing margin compared with other types of resistance-switching memory devices, such as phase change random access memory (PCRAM) and resistive random access memory (ReRAM). The resistance ratio of high-to-low resistance state of MRAM is about 2-3, compared with $10^2$-$10^5$ for PCRAM and ReRAM.

FIG. 2 is a plot showing the resistance distributions 40 and 42 respectively corresponding to the low and high resistance states of an MTJ population. The x-axis represents the electrical resistance while the y-axis represents the number of MTJs having a particular electrical resistance. An MTJ having a resistance that falls within the $R_L$ distribution 40 is considered to be in the low resistance ($R_L$) state. Likewise, an MTJ having a resistance that falls within the $R_H$ distribution 42 is considered to be in the high resistance ($R_H$) state. The resistance state of the MTJ may be determined during a read operation by comparing the resistance of the MTJ with a reference resistance ($R_{REF}$) that is somewhere in between the $R_L$ distribution 40 and the $R_H$ distribution 42. One way to establish $R_{REF}$ is to simply take the average of the mean of $R_L$ distribution and the mean of $R_H$ distribution as shown in the plot. While being relatively simple, this method results in reduced sensing margin for the high resistance state because of the inherently broader distribution thereof. Another way to select $R_{REF}$ is to choose the midpoint in the gap between the $R_L$ and $R_H$ distributions 40 and 42 (e.g., the average of $R_L$ mean+3σ and $R_H$ mean−3σ) as shown. Compared with the former method, the latter method improves the sensing margin for the high resistance state at room temperature, but suffers the same problem at elevated temperatures as the resistance of MTJ decreases.

For the foregoing reasons, there is a need for a circuit and a method for improving the sensing margin of MRAM.

SUMMARY

The present invention is directed to a nonvolatile memory device comprising a plurality of memory slices, each memory slice including one or more memory sectors and a read circuit for sensing the resistance state of a magnetic memory cell in the one or more memory sectors. The read circuit comprises a first input node through which a reference current passes; a second input node through which a read current from the one or more memory sectors passes; a sense amplifier configured to compare input voltages and having first and second input terminals; a reference resistor connected to the first input node at one end and the first input terminal of the sense amplifier at the other end; a first current source connected to the reference resistor at one end and ground at the other end; and a second current source connected to the second input node at one end and ground at the other end. The current source is a variable current source.

According to another aspect of the present invention, a nonvolatile memory device comprises a plurality of memory slices, each memory slice including one or more memory sectors and a read circuit for sensing the resistance state of a magnetic memory cell in the one or more memory sectors. The read circuit comprises a first input node through which a reference current passes; a second input node through which a read current from the one or more memory sectors passes; a sense amplifier configured to compare input voltages and having first and second input terminals connected to the first and second input nodes, respectively; a first current source connected to the first input node at one end and ground at the other end; and a second current source connected to the second input node at one end and ground at the other end. The first current source is a variable current source.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element(s) as illustrated in the figure. Since articles and elements can be positioned in a number of different orientations, these terms are intended for illustration purposes and in no way limit the invention, except where the context excludes that possibility.

Figure 3:
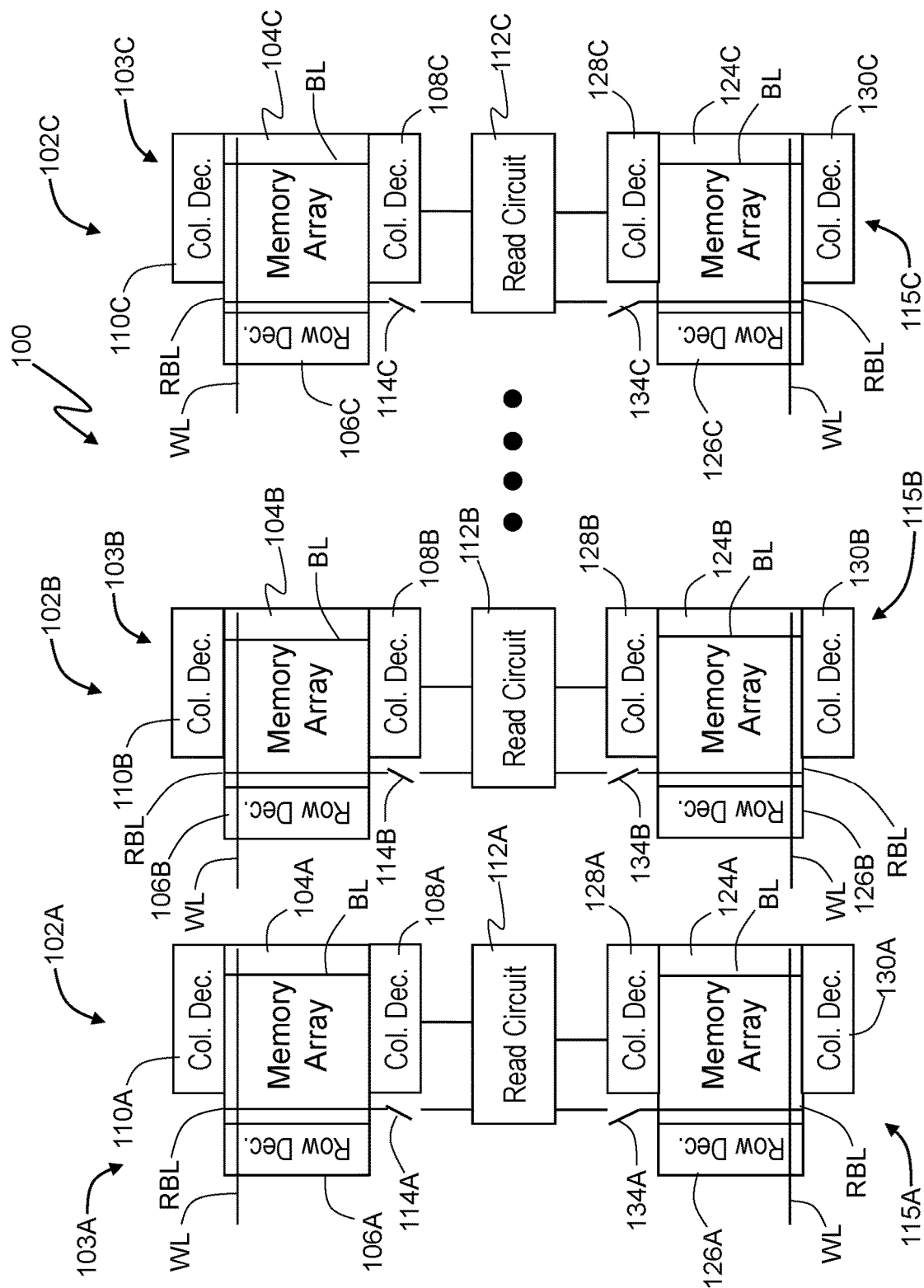
FIG. 3 is a block diagram illustrating components of a memory device in accordance with an exemplary embodiment of the present invention.

FIG. 3 is a block diagram illustrating components of a memory device 100 in accordance with an exemplary embodiment of the present invention. The memory device 100 includes a plurality of I/O or memory slices represented by memory slices 102A-102C. Each of the memory slices 102A-102C has independent input/output from other slices and may include one or two memory sectors. Each memory slice (e.g., 102A) may include a first memory sector (e.g., 103A) and a read circuit (e.g., 112A) connected thereto. The first memory sector 103A includes a first memory array 104A, a first row decoder 106A for selecting one of word lines (WLs) traversing the first memory array 104A along a first direction, a first column decoder 108A for selecting a bit line (BL) traversing the first memory array 104A along a second direction substantially perpendicular to the first direction, and a second column decoder 110A for selecting a source line (not shown) traversing the memory array 104A along the second direction. The read circuit 112A is connected to the output of the first column decoder 108A.

Figure 1:
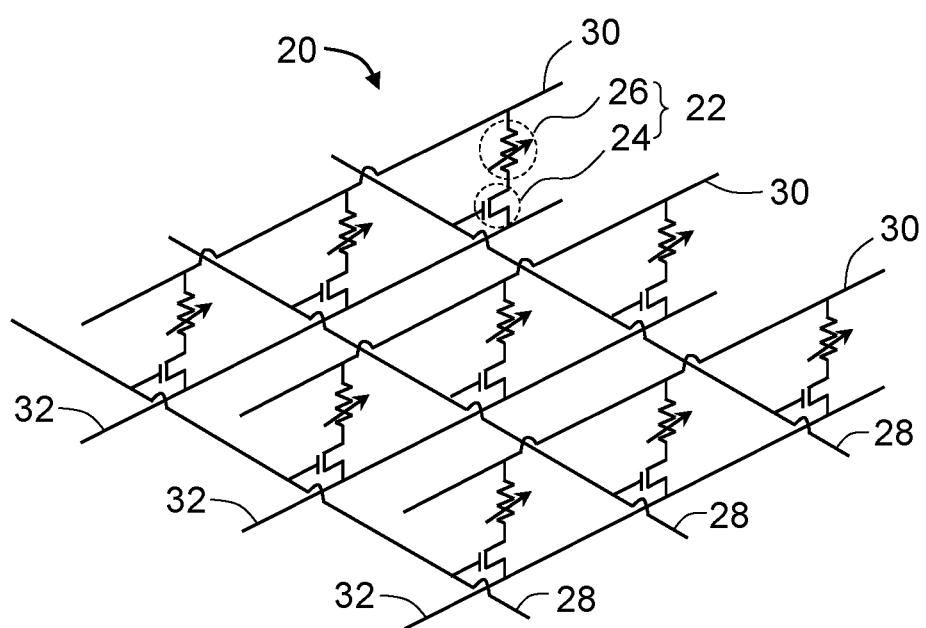
FIG. 1 is a schematic circuit diagram of an array of memory cells with each memory cell including a resistance-switching memory element and an access transistor coupled in series between a bit line and a source line.
Figure 2:
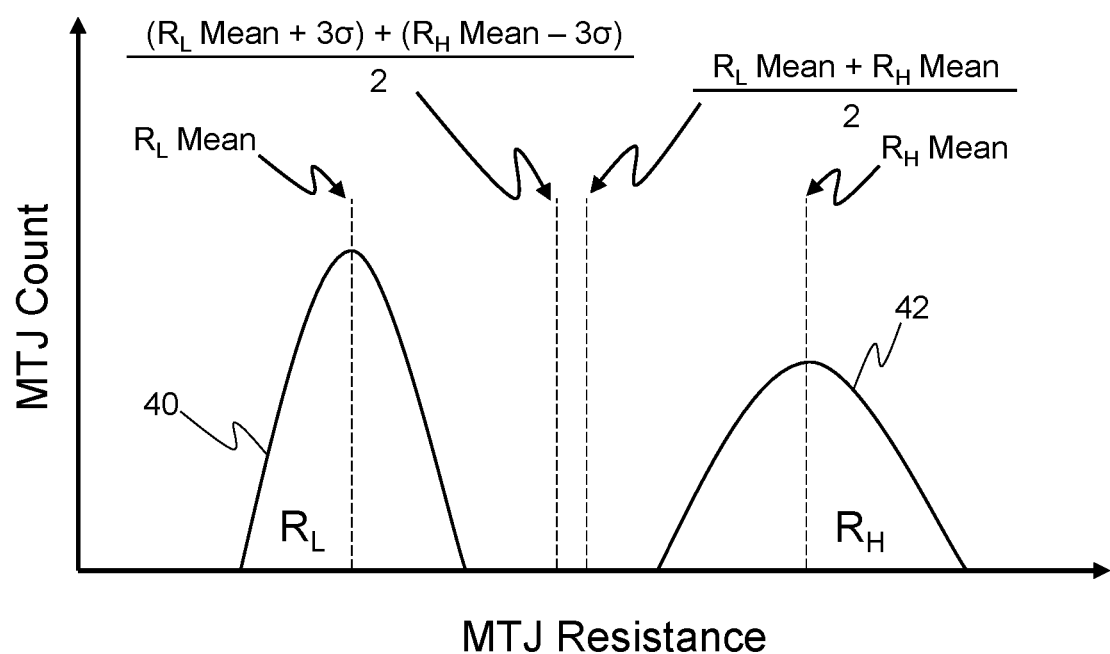
FIG. 2 is a plot showing low and high resistance distributions for a sample population of magnetic tunnel junctions (MTJs)

The first memory array 104A is analogous to the memory array 20 shown in FIG. 1 and includes a plurality of memory cells arranged in rows and columns (not shown), a plurality of parallel word lines (WLs), a plurality of parallel bit lines (BLs), and a plurality of parallel source lines (not shown). The first memory array 104A may also include a reference bit line (RBL) connected to the read circuit 112A through a first switch 114A. The reference bit line (RBL) may provide a reference signal or current to the read circuit 112A when determining the resistance state of a memory cell in the memory array 104A.

Each memory slice (e.g., 102A) may further include a second memory sector (e.g., 115A) connected to the read circuit (e.g., 112A). The second memory sector 115A includes a second memory array 124A, a second row decoder 126A for selecting a word line (WL) traversing the second memory array 124A along the first direction, a third column decoder 128A for selecting a bit line (BL) traversing the second memory array 124A along the second direction substantially perpendicular to the first direction, and a fourth column decoder 130A for selecting a source line (not shown) traversing the memory array 124A along the second direction. The second memory array 124A may also include a reference bit line (RBL) connected to the read circuit 112A through a second switch 134A. The first and second memory sectors 103A and 115A may be physically arranged in a mirror-image geometry on opposite sides of the read circuit 112A that acts as the mirror line.

Figure 4:
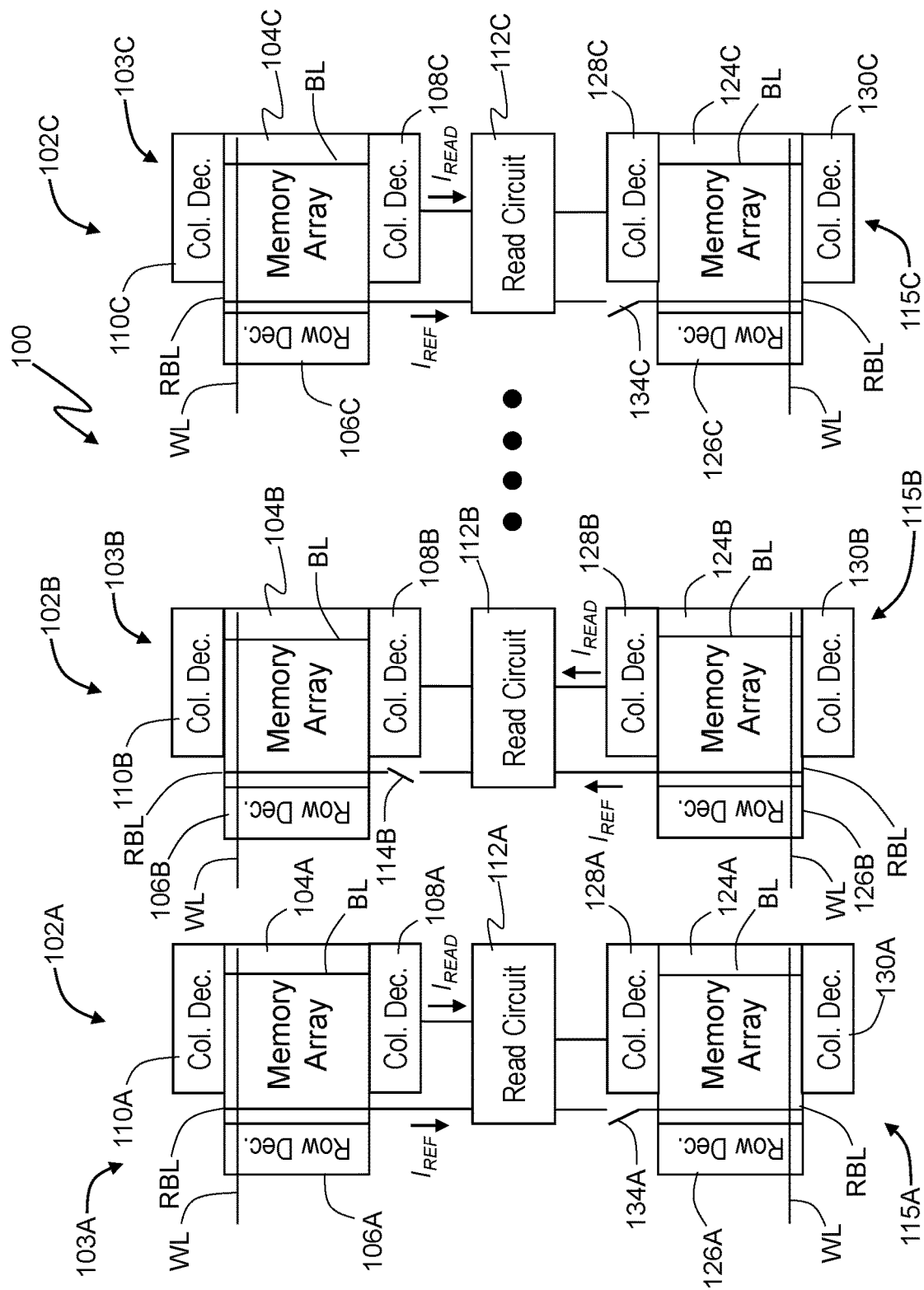
FIG. 4 is a diagram illustrating an example of the read and reference current paths for the memory device of FIG. 3 in a read operation.

Since each of the memory slices 102A-102C includes a respective one of the read circuits 112A-112C, a memory cell from each of the memory slices 102A-102C may be independently sensed at the same time. For example and without limitation, FIG. 4 shows that a memory cell from the first memory sector 103A of the first memory slice 102A, another memory cell from the second memory sector 115B of the second memory slice 102B, and still another memory cell from the first memory sector 103C of the last memory slice 102C are simultaneously sensed. During the sensing or read operation, the read current, $I_{READ}$, passes through the memory cell selected for the read operation, the bit line connected thereto, and reaches the read circuit via the first or third column decoder, while the reference current ($I_{REF}$) passes through the reference bit line (RBL) to reach the read circuit via the first or second switch.

Figure 5:
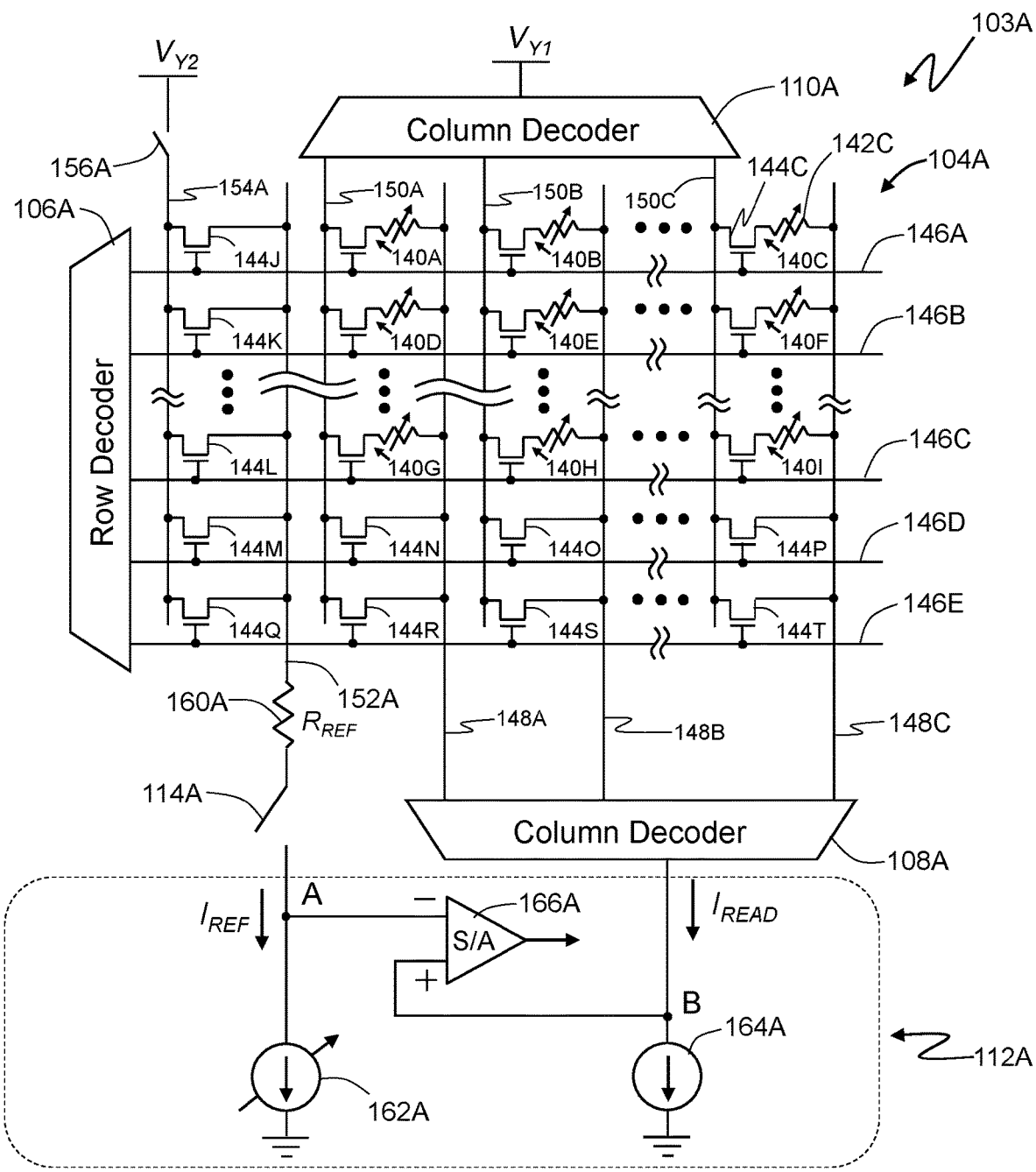
FIG. 5 is a schematic circuit diagram of a memory section and an exemplary read circuit of the memory device of FIG. 3.

FIG. 5 is schematic circuit diagram showing the first memory sector 103A and an exemplary circuit for the read circuit 112A of the first memory slice 102A. The first memory sector 103A includes the first memory array 104A, the first row decoder 106A, the first and second column decoders 108A and 110A, and the first switch 114A. The first memory array 104A includes a plurality of memory cells arranged in rows and columns as represented by cells 140A-140I, a plurality of word lines represented by lines 146A-146C, a plurality of bit lines represented by lines 148A-148C, and a plurality of source lines represented by lines 150A-150C. Each memory cell (e.g., 140C) includes a resistance-switching memory element (e.g., 142C) and an access transistor (e.g., 144C) coupled in series between a respective one of the bit lines (e.g., 148C) and a respective one of the source lines (e.g., 150C). Each of the plurality of word lines 146A-146C is coupled to the gates of a respective row of the access transistors in a first direction. Each of the plurality of bit lines 148A-148C is coupled to a respective column of the memory cells 140A-140I at one end thereof (e.g., memory element) along a second direction. Each of the plurality of source lines 150A-150C is coupled to a respective column of the memory cells 140A-140I at the other end thereof (e.g., access transistor) along the second direction. The first and second directions may be substantially orthogonal to each other. The positions of the resistance-switching memory element (e.g., 142C) and the access transistor (e.g., 144C) in a memory cell (e.g., 140C) may be swapped such that the memory element (e.g., 142C) and the access transistor (e.g., 144C) are disposed adjacent to the source line (e.g., 150C) and the bit line (e.g., 148C), respectively.

Each of the resistance-switching memory elements (e.g., 142C) may change the resistance state thereof by any suitable switching mechanism, such as but not limited to phase change, precipitate bridging, magnetoresistive switching, or any combination thereof. In one embodiment, the memory element 142C comprises a phase change chalcogenide compound, such as but not limited to $Ge_2Sb_2Te_5$ or AgInSbTe, which can switch between a resistive phase and a conductive phase. In another embodiment, the memory element 142C comprises a nominally insulating metal oxide material, such as but not limited to NiO, $TiO_2$, or Sr(Zr)$TiO_3$, which can switch to a lower electrical resistance state as metal rich precipitates grow and link to form conductive paths upon application of an appropriate voltage. In still another embodiment, the memory element 142C comprises a magnetic free layer, a magnetic reference layer, and an insulating electron tunnel junction layer interposed therebetween, which collectively form a magnetic tunnel junction (MTJ). When a switching current is directly applied to the MTJ, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may be oriented parallel to the respective layer planes.

The first memory array 104A further includes a column of access transistors 144J-144L with the gate of each access transistor coupled to a respective one of the word lines 146A-146C. The column of access transistors 144J-144L, which are used to control the reference current during sensing, can be regarded as "dummy" cells without memory elements. The column of access transistors 144J-144L are coupled to a reference bit line 152A at one of the source and drain and to a reference source line 154A at the other one of the source and drain. The first memory array 104A may further include one or more rows of access transistors 144M-144T connected to one or more word lines 146D and 146E at the gates thereof. Each transistor of the rows of the access transistors 144M-144T is connected to a respective one of the bit lines 148A-148C or the reference bit line 152A at one of the source and drain and to a respective one of the source lines 150A-150C or the reference source line 154A at the other one of the source and drain. The first memory array 104A may further include a reference resistor ($R_{REF}$) 160A connected to the reference bit line 152A at one end and the first switch 114A at the other end. Accordingly, the reference current ($I_{REF}$) from the reference source line 154A passes one of the column of access transistors 144J-144L, the reference bit line 152A, the reference resistor ($R_{REF}$) 160A, and the first switch 114A to reach the read circuit 112A. The reference resistor ($R_{REF}$) 160A may have a fixed resistance.

All of the word lines 146A-146E may be connected to the row decoder 106A, which allows one the word line 146A-146E to be selected for read or write operation. A voltage ($V_{y1}$) may be applied to one of the source lines 150A-150C via the second column decoder 110A connected thereto during the read or write operation. Similarly, another voltage (e.g., $V_{y2}$) may be applied to the reference source line 154A through a third switch 156A. In an embodiment, the voltages $V_{y1}$ and $V_{y2}$ are set to the same voltage ($V_{READ}$) during the read operation. The first column decoder 108A connected to the bit lines 148A-148C allows one of the bit lines 148A-148C to be connected to Node B of the read circuit 112A. Likewise, the reference bit line 152A may be connected to Node A of the read circuit 112A via the first switch 114A.

The read circuit 112A includes two input terminals at Nodes A and B, a first current source 162A connected to Node A at one end and ground at the other end, a second current source 164A connected to Node B at one end and ground at the other end, and a sense amplifier 166A with one input (e.g., negative terminal) connected to Node A and the other input (e.g., positive terminal) connected to Node B. In an embodiment, the first current source 162A is a variable current source that comprises a plurality of transistors connected in parallel between Node A and ground. The plurality of transistors may be individually controlled, thereby modulating the reference current ($I_{REF}$) that passes therethrough.

In a read operation, a memory cell (e.g., 140C) is selected for sensing by selecting the word line (e.g., 146A) connected thereto. The source line 150C connected to the selected memory cell 140C is selected by the second column decoder 110A and may have a potential of $V_{READ}$. The bit line 148C connected to the selected memory cell 140C is selected by the first column decoder 108A, thereby allowing the read current ($I_{READ}$) to flow from the source line 150C, through the access transistor 144C, the memory element 142C, the bit line 148C, and the first column decoder 108A, to Node B of the read circuit 112A. From Node B, the read current ($I_{READ}$) passes through the second current source 164A to ground.

The selection of the word line 146A during the read operation and activation of the first and third switches 114A and 156A allow the reference current ($I_{REF}$) to flow from the reference source line 154A, which may have a potential of $V_{READ}$ applied thereto, through the access transistor 144J, the reference bit line 152A, the reference resistor ($R_{REF}$) 160A, and the first switch 114A, to Node A of the read circuit 112A. From Node A, the reference current ($I_{REF}$) passes through the first current source 162A to ground.

The sense amplifier 166A measures the voltage differential between Nodes A and B along the reference current path and the read current path, respectively. When the memory element 142C is in the low resistance ($R_L$) state, the voltage drop across the memory element 142C is less than the voltage drop when the memory element 142C is in the high resistance ($R_H$) state. Accordingly, the voltage at Node B will be higher when the memory element 142C is in the $R_L$ state as compared to the $R_H$ state. Ideally, the reference voltage at Node A should be between the $R_L$ and $R_H$ voltages at Node B for all memory elements in the first memory array 104A. The reference voltage at Node A may be determined by performing a binary search or other search methods using a sample population of the memory elements with half written to the $R_L$ state and the other half written to the $R_H$ state. The number of the memory elements in the sample population may range from a few to the entire memory array 104C. The search process may be carried out by varying the current setting on the variable current source 162A, which in turn would change the reference current ($I_{REF}$) and the reference voltage at Node A, until the sense amplifier 166A counts half of the sample population in the $R_L$ state and the other half of the sample population in the $R_H$ state. The process of adjusting the variable current source 162A to set the reference voltage at Node A may be repeated for the second memory sector 115A of the first memory slice 102A. Accordingly, different memory sectors may use different reference current settings, which may result in different reference voltages for the sense amplifier 166A.

Figure 6:
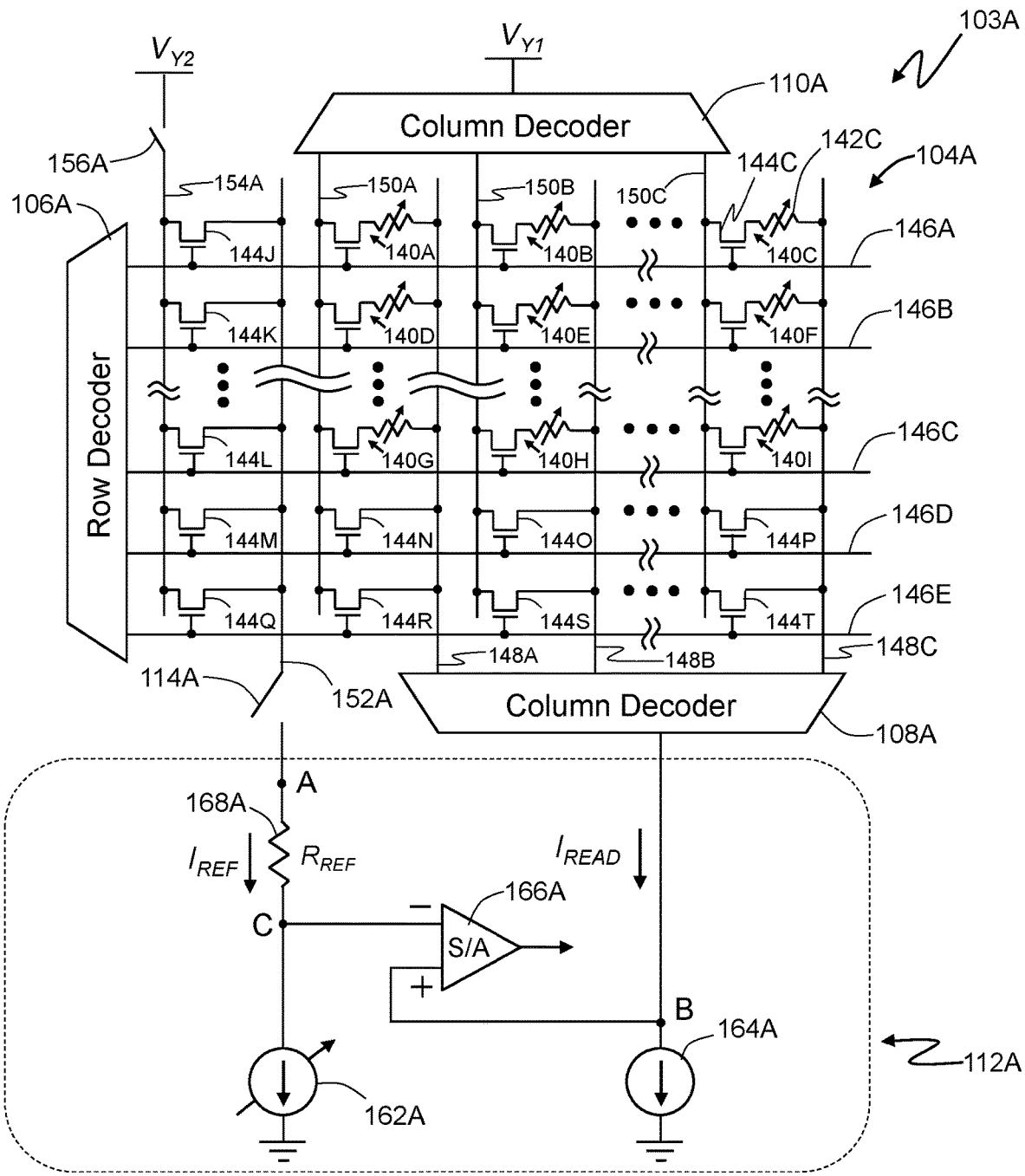
FIG. 6 is a schematic circuit diagram of a memory section and another exemplary read circuit of the memory device of FIG. 3.

FIG. 6 is schematic circuit diagram showing the first memory sector 103A and another exemplary circuit for the read circuit 112A of the first memory slice 102A shown in FIG. 3. In the drawing, numerals 104A to 166A denote the same components or elements as those shown for the first embodiment in FIG. 5. The first memory sector 103A and the read circuit 112A shown in FIG. 6 are different from the first embodiment in that the reference resistor ($R_{REF}$) 160A in the first memory array 104A, as shown in FIG. 5, is replaced by the reference resistor ($R_{REF}$) 168A in the read circuit 112A. This change effectively moves the reference resistor 160A from the memory array 104A to the read circuit 112A along the reference current path, thereby allowing all memory sectors 103A and 115A connected to the read circuit 112A to share the same reference resistor 168A.

The read circuit 112A of FIG. 6 includes two input terminals at Nodes A and B, the reference resistor 168A connected to Node A at one end and Node C at the other end, a first current source 162A connected to Node C at one end and ground at the other end, a second current source 164A connected to Node B at one end and ground at the other end, and a sense amplifier 166A with one input (e.g., negative terminal) connected to Node C and the other input (e.g., positive terminal) connected to Node B. In an embodiment, the first current source 162A is a variable current source that comprises a plurality of transistors connected in parallel between Node C and ground. The plurality of transistors may be individually controlled, thereby modulating the reference current ($I_{REF}$) that passes therethrough.

In a read operation, a memory cell (e.g., 140C) is selected for sensing by selecting the word line (e.g., 146A) connected thereto. The source line 150C connected to the selected memory cell 140C is selected by the second column decoder 110A and may have a potential of $V_{READ}$. The bit line 148C connected to the selected memory cell 140C is selected by the first column decoder 108A, thereby allowing the read current ($I_{READ}$) to flow from the source line 150C, through the access transistor 144C, the memory element 142C, the bit line 148C, and the first column decoder 108A, to Node B of the read circuit 112A. From Node B, the read current ($I_{READ}$) passes through the second current source 164A to ground.

The selection of the word line 146A during the read operation and activation of the first and third switches 114A and 156A allow the reference current ($I_{REF}$) to flow from the reference source line 154A, which may have a potential of $V_{READ}$ applied thereto, through the access transistor 144J, the reference bit line 152A, and the first switch 114A, to Node A of the read circuit 112A. From Node A, the reference current ($I_{REF}$) passes through the reference resistor ($R_{REF}$) 168A and the first current source 162A to ground.

The sense amplifier 166A measures the voltage differential between Nodes C and B along the reference current path and the read current path, respectively. When the memory element 142C is in the low resistance ($R_L$) state, the voltage drop across the memory element 142C is less than the voltage drop when the memory element 142C is in the high resistance ($R_H$) state. Accordingly, the voltage at Node B will be higher when the memory element 142C is in the $R_L$ state as compared to the $R_H$ state. Ideally, the reference voltage at Node C should be between the $R_L$ and $R_H$ voltages at Node B for all memory elements in the first memory array 104A. The reference voltage at Node C may be determined by performing a binary search or other search methods using a sample population of the memory elements with half written to the $R_L$ state and the other half written to the $R_H$ state. The number of the memory elements in the sample population may range from a few to the entire memory array 104C. The search process may be carried out by varying the current setting on the variable current source 162A, which in turn would change the reference current ($I_{REF}$) and the reference voltage at Node C, until the sense amplifier 166A counts half of the sample population in the $R_L$ state and the other half of the sample population in the $R_H$ state. The process of adjusting the variable current source 162A to set the reference voltage at Node C may be repeated for the second memory sector 115A of the first memory slice 102A. Accordingly, different memory sectors may use different reference current settings, which may result in different reference voltages for the sense amplifier 166A.

Figure 7:
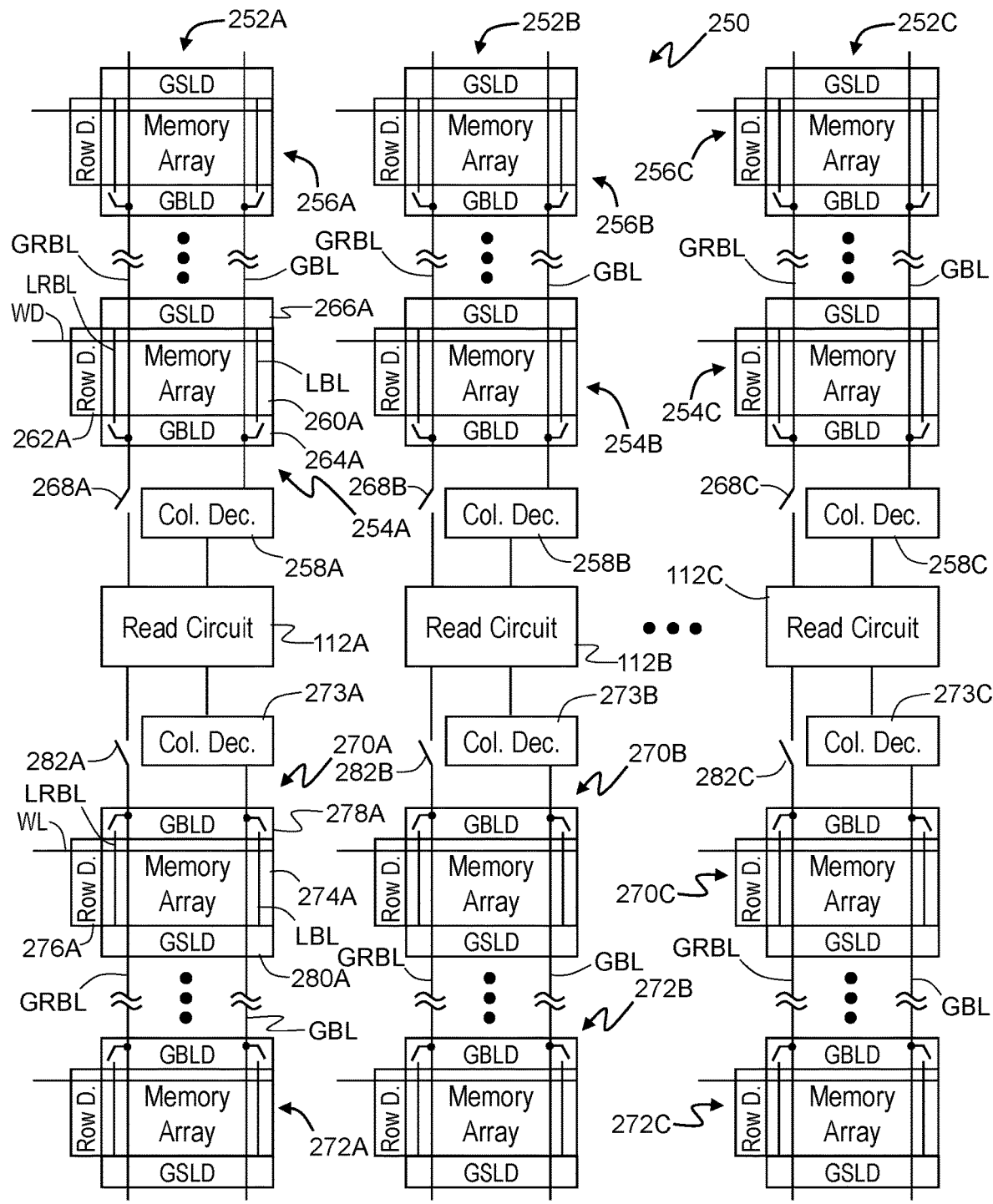
FIG. 7 is a block diagram illustrating components of a memory device in accordance with another exemplary embodiment of the present invention.

FIG. 7 is a block diagram illustrating components of a memory device 250 in accordance with another exemplary embodiment of the present invention. The memory device 250 includes a plurality of I/O or memory slices represented by memory slices 252A-252C. Each of the memory slices 252A-252C has independent input/output from other slices and may include two or more memory sectors. Each memory slice (e.g., 252A) may include a first plurality of memory sectors (e.g., 254A and 256A) connected to a first plurality of global bit lines (GBLs), which may be further connected to a read circuit (e.g., 112A) through a first column decoder (e.g., 258A). Each memory sector (e.g., 254A) includes a memory array (e.g., 260A), a row decoder (e.g., 262A) for selecting a word line (WL) traversing the memory array 260A along a first direction, a global bit line decoder (GBLD) (e.g., 264A) for connecting a local bit line (LBL) to a respective one of the first plurality of global bit lines (GBLs) traversing the first plurality of memory sectors 254A and 256A along a second direction substantially perpendicular to the first direction, and a global source line decoder (GSLD) (e.g., 266A) for connecting a local source line (not shown) to a respective one of a first plurality of global source lines (not shown) traversing the first plurality of memory sectors 254A and 256A along the second direction.

The memory array 260A is analogous to the first memory array 104A shown in FIG. 5 or FIG. 6 and includes a plurality of memory cells arranged in rows and columns (not shown), a plurality of parallel word lines (WLs), a plurality of local bit lines (LBLs), and a plurality of local source lines (not shown). The memory array 260A may also include a local reference bit line (LRBL) connected to a first global reference bit line (GRBL) through the global bit line decoder (GBLD) 264A. The first global reference bit line (GRBL) may be connected to the read circuit 112A through a first switch 268A. The first global reference bit line (GRBL) may provide a reference signal or current to the read circuit 112A when sensing the resistance state of a memory cell in the first plurality of memory sectors 254A and 256A. Other memory sectors in the first plurality of memory sectors 254A and 256A may be substantially identical to the memory sector 254A.

Each memory slice (e.g., 252A) may further include a second plurality of memory sectors (e.g., 270A and 272A) connected to a second plurality of global bit lines (GBLs), which may be further connected to the read circuit (e.g., 112A) through a second column decoder (e.g., 273A). Like the first plurality of memory sectors 254A and 256A, each of the second plurality of memory sectors (e.g., 270A) includes a memory array (e.g., 274A), a row decoder (e.g., 276A) for selecting a word line (WL) traversing the memory array 274A along the first direction, a global bit line decoder (GBLD) (e.g., 278A) for connecting a local bit line (LBL) to a respective one of a second plurality of global bit lines (GBLs) traversing the second plurality of memory sectors 270A and 272A along the second direction substantially perpendicular to the first direction, and a global source line decoder (GSLD) (e.g., 280A) for connecting a local source line (not shown) to a respective one of a second plurality of global source lines (not shown) traversing the second plurality of memory sectors 270A and 272A along the second direction. The memory sector 270A may also include a local reference bit line (LRBL) connected to a second global reference bit line (GRBL) through the global bit line decoder (GBLD) 278A. The second global reference bit line (GRBL) traverses the second plurality of memory sectors 270A and 272A along the second direction and connects local reference bit lines of the second plurality of memory sectors 270A and 272A to the read circuit 112A via a second switch 282A. The second global reference bit line (GRBL) may provide a reference signal or current to the read circuit 112A when sensing the resistance state of a memory cell in the second plurality of memory sectors 270A and 272A. Other memory sectors in the second plurality of memory sectors 270A and 272A may be substantially identical to the memory sector 270A. Moreover, the first and second plurality of memory sectors may be physically arranged in a mirror-image geometry on opposite sides of the read circuit 112A that acts as the mirror line.

Figure 8:
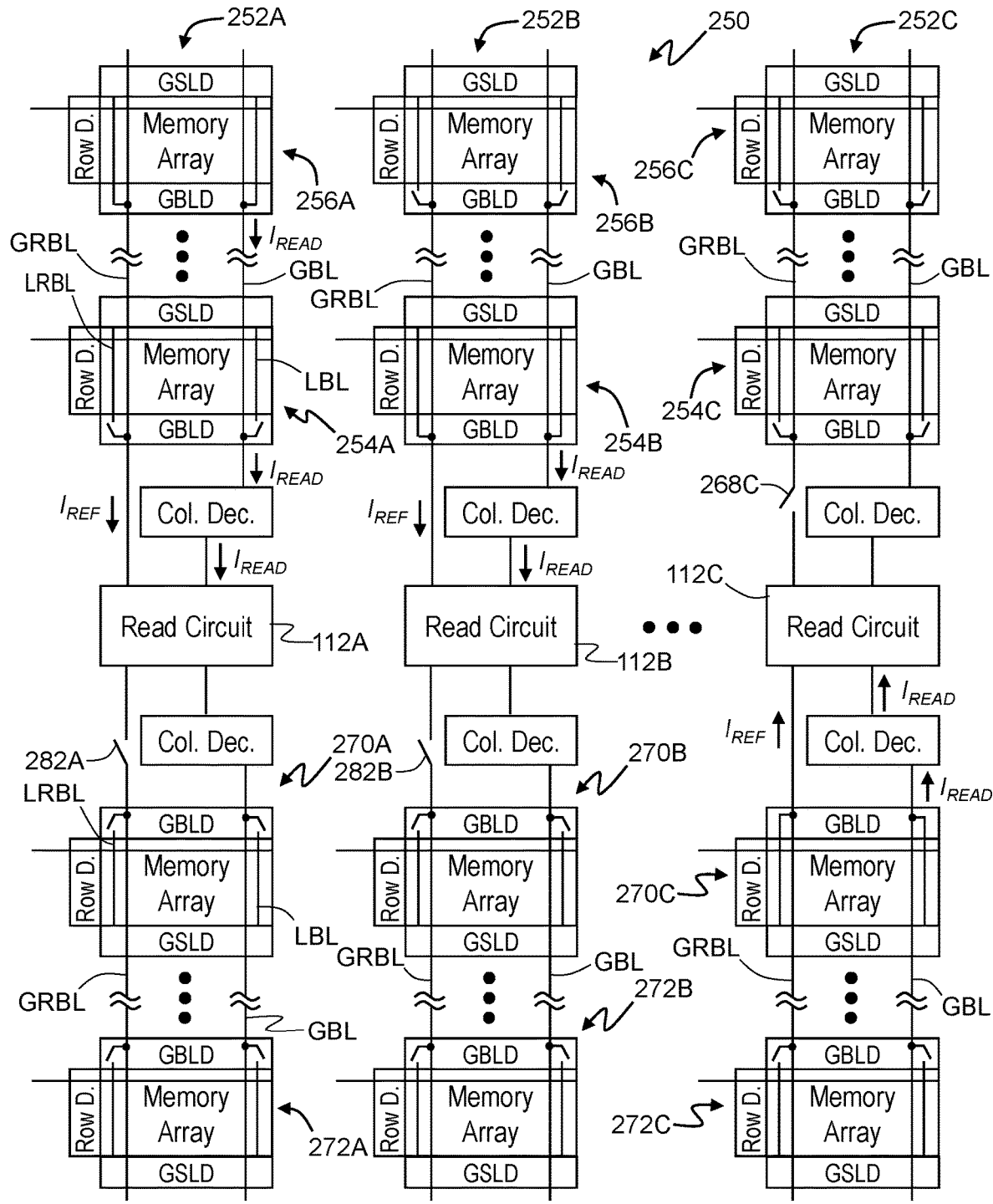
FIG. 8 is a diagram illustrating an example of the read and reference current paths for the memory device of FIG. 7 in a read operation.

Since each of the memory slices 252A-252C includes a respective one of the read circuits 112A-112C, a memory cell from each of the memory slices 252A-252C may be independently sensed at the same time. For example and without limitation, FIG. 8 shows that a memory cell from the memory sector 256A of the first memory slice 252A, another memory cell from the memory sector 254B of the second memory slice 252B, and still another memory cell from the memory sector 270C of the last memory slice 252C are simultaneously sensed. During the sensing or read operation, the read current, $I_{READ}$, passes through the memory cell selected for the read operation, the local bit line (LBL) connected to the selected memory cell, and the global bit line (GBL) connected to the local bit line (LBL), and reaches the read circuit via the first or second column decoder, while the reference current ($I_{REF}$) passes through the local reference bit line (LRBL) and the global reference bit line (GRBL) to reach the read circuit via the first or second switch.

Figure 9:
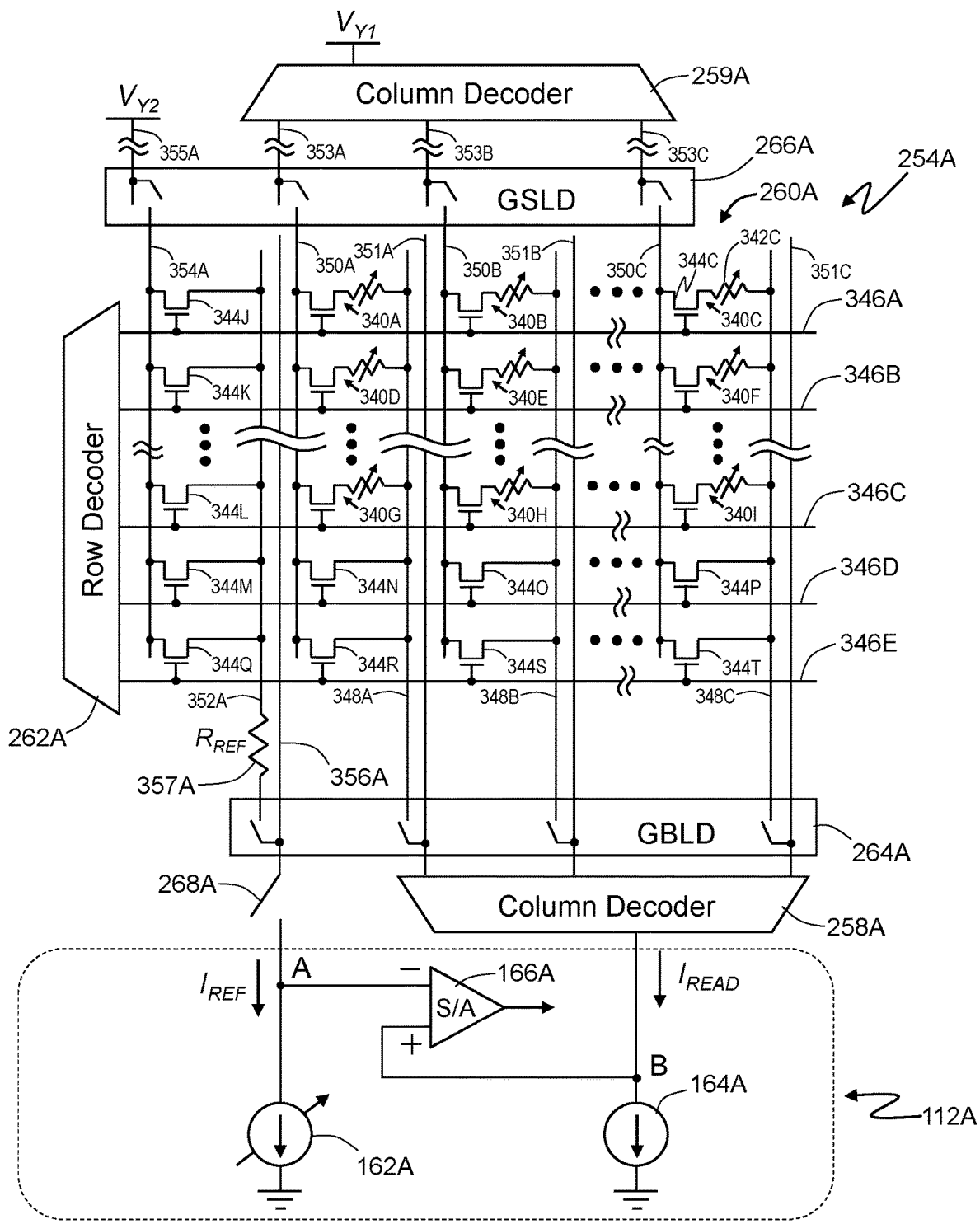
FIG. 9 is a schematic circuit diagram of a memory section and an exemplary read circuit of the memory device of FIG. 7.

FIG. 9 is schematic circuit diagram showing the memory sector 254A, the first column decoder 258A, the first switch 268A, an exemplary circuit for the read circuit 112A, the first plurality of global bit lines 351A-351C, the first plurality of global source lines 353A-353C, and a third column decoder 259A of the first memory slice 252A. The memory sector 254A includes the memory array 260A, the row decoder 262A, the global bit line decoder (GBLD) 264A, and the global source line decoder (GSLD) 266A. The memory array 260A includes a plurality of memory cells arranged in rows and columns as represented by cells 340A-340I, a plurality of word lines represented by lines 346A-346C, a plurality of local bit lines represented by lines 348A-348C, and a plurality of local source lines represented by lines 350A-350C. Each memory cell (e.g., 340C) includes a resistance-switching memory element (e.g., 342C) and an access transistor (e.g., 344C) coupled in series between a respective one of the local bit lines (e.g., 348C) and a respective one of the local source lines (e.g., 350C). Each of the plurality of word lines 346A-346C is coupled to the gates of a respective row of the access transistors in a first direction. Each of the plurality of local bit lines 348A-348C is coupled to a respective column of the memory cells 340A-340I at one end thereof (e.g., memory element) along a second direction. Each of the plurality of local source lines 350A-350C is coupled to a respective column of the memory cells 340A-340I at the other end thereof (e.g., access transistor) along the second direction. The first and second directions may be substantially orthogonal to each other. The positions of the resistance-switching memory element (e.g., 342C) and the access transistor (e.g., 344C) in a memory cell (e.g., 340C) may be swapped such that the memory element (e.g., 342C) and the access transistor (e.g., 344C) are disposed adjacent to the local source line (e.g., 350C) and the local bit line (e.g., 348C), respectively. At the global bit line decoder (GBLD) 264A, each of the plurality of local bit lines 348A-348C may be connected to a respective one of the first plurality of global bit lines 351A-351C traversing the first plurality of memory sectors 254A and 256A along the second direction. The first plurality of global bit lines 351A-351C may be connected to the read circuit 112A at Node B through the first column decoder 258A. At the global source line decoder (GSLD) 266A, each of the plurality of local source lines 350A-350C may be connected to a respective one of the first plurality of global source lines 353A-353C traversing the first plurality of memory sectors 254A and 256A along the second direction. The first plurality of global source lines 353A-353C may be further connected to the third column decoder 259A, which may select one of the global source lines 353A-353C for read or write operation.

Each of the resistance-switching memory elements (e.g., 342C) may change the resistance state thereof by any suitable switching mechanism, such as but not limited to phase change, precipitate bridging, magnetoresistive switching, or any combination thereof. In one embodiment, the memory element 342C comprises a phase change chalcogenide compound, such as but not limited to $Ge_2Sb_2Te_5$ or AgInSbTe, which can switch between a resistive phase and a conductive phase. In another embodiment, the memory element 342C comprises a nominally insulating metal oxide material, such as but not limited to NiO, $TiO_2$, or Sr(Zr)$TiO_3$, which can switch to a lower electrical resistance state as metal rich precipitates grow and link to form conductive paths upon application of an appropriate voltage. In still another embodiment, the memory element 342C comprises a magnetic free layer, a magnetic reference layer, and an insulating electron tunnel junction layer interposed therebetween, which collectively form a magnetic tunnel junction (MTJ). When a switching current is directly applied to the MTJ, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may be oriented parallel to the respective layer planes.

The memory array 260A further includes a column of access transistors 344J-344L with the gate of each access transistor coupled to a respective one of the word lines 346A-346C. The column of access transistors 344J-344L, which are used to control the reference current during sensing, can be regarded as "dummy" cells without memory elements. The column of access transistors 344J-344L are coupled to a local reference bit line 352A at one of the source and drain and to a local reference source line 354A at the other one of the source and drain. At the global bit line decoder 264A, the local reference bit line 352A may be connected to the first global reference bit line 356A, which in turn may be connected to the read circuit 112A at Node A through the first switch 268A. The memory array 260A may further include a reference resistor 357A connected to the local reference bit line 352A at one end and the global bit line decoder 264A at the other end. At the global source line decoder 266A, the local reference source line 354A may be connected to a global reference source line 355A traversing the first plurality of memory sectors 254A and 256A along the second direction. The memory array 260A may further include one or more rows of access transistors 344M-344T connected to one or more word lines 346D and 346E at the gates thereof. Each transistor of the rows of the access transistors 344M-344T is connected to a respective one of the local bit lines 348A-348C or the local reference bit line 352A at one of the source and drain and to a respective one of the local source lines 350A-350C or the local reference source line 354A at the other one of the source and drain.

All of the word lines 346A-346E may be connected to the row decoder 262A, which allows one the word line 346A-346E to be selected for read or write operation. A voltage ($V_{Y1}$) may be applied to one of the first plurality of global source lines 353A-353C through the third column decoder 259A during the read or write operation. The first plurality of global source lines 353A-353C may, in turn, be connected to the local source lines 350A-350C via the global source line decoder (GSLD) 266A. Similarly, another voltage (e.g., $V_{Y2}$) may be applied to the local reference source line 354A from the first global reference source line 355A via the global source line decoder (GSLD) 266A. In an embodiment, the voltages $V_{Y1}$ and $V_{Y2}$ are set to the same voltage ($V_{READ}$) during the read operation. The first column decoder 258A connected to the first plurality of global bit lines 351A-351C allows one of the global bit lines 351A-351C to be connected to Node B of the read circuit 112A. Likewise, the first global reference bit line 356A, which provides the reference signal in the read operation, may be connected to Node A of the read circuit 112A via the first switch 268A.

In a read operation, a read voltage (i.e., $V_{READ}$) is applied to a selected one of the first plurality of global source lines 353A-353C, causing a read current ($I_{READ}$) to flow from the selected global source line (e.g., 353C) through the global source line decoder (GSLD) 266A, a respective one of the local source lines (e.g., 350C) connected to the selected global source line 353C, a memory cell (e.g., 340C) connected to the local source line 350C and a selected word line (e.g., 346A), a local bit line (e.g., 348C) connected to the selected memory cell 340C, the global bit line decoder (GBLD) 264A, a respective one of the first plurality of global bit lines (e.g., 351C), and the first column decoder 258A, to Node B of the read circuit 112A. Meanwhile, a reference voltage (e.g., $V_{READ}$) may be applied to the first global reference source line 355A, thereby causing a reference current ($I_{REF}$) to flow from the first global reference source line 355A through the global source line decoder (GSLD) 266A, the local reference source line 354A, one of the column of access transistors (e.g., 344J) connected to the selected word line 346A, the local reference bit line 352A, the reference resistor ($R_{REF}$) 357A, the global bit line decoder (GBLD) 264A, the first global reference bit line 356A, and the first switch 268A, to Node A of the read circuit 112A. The reference current ($I_{REF}$) does not pass through any of the memory cells (340A-340I).

The read circuit 112A of FIG. 9 and operation thereof are substantially identical to the read circuit 112A and its operation shown in FIG. 5 and described above.

Figure 10:
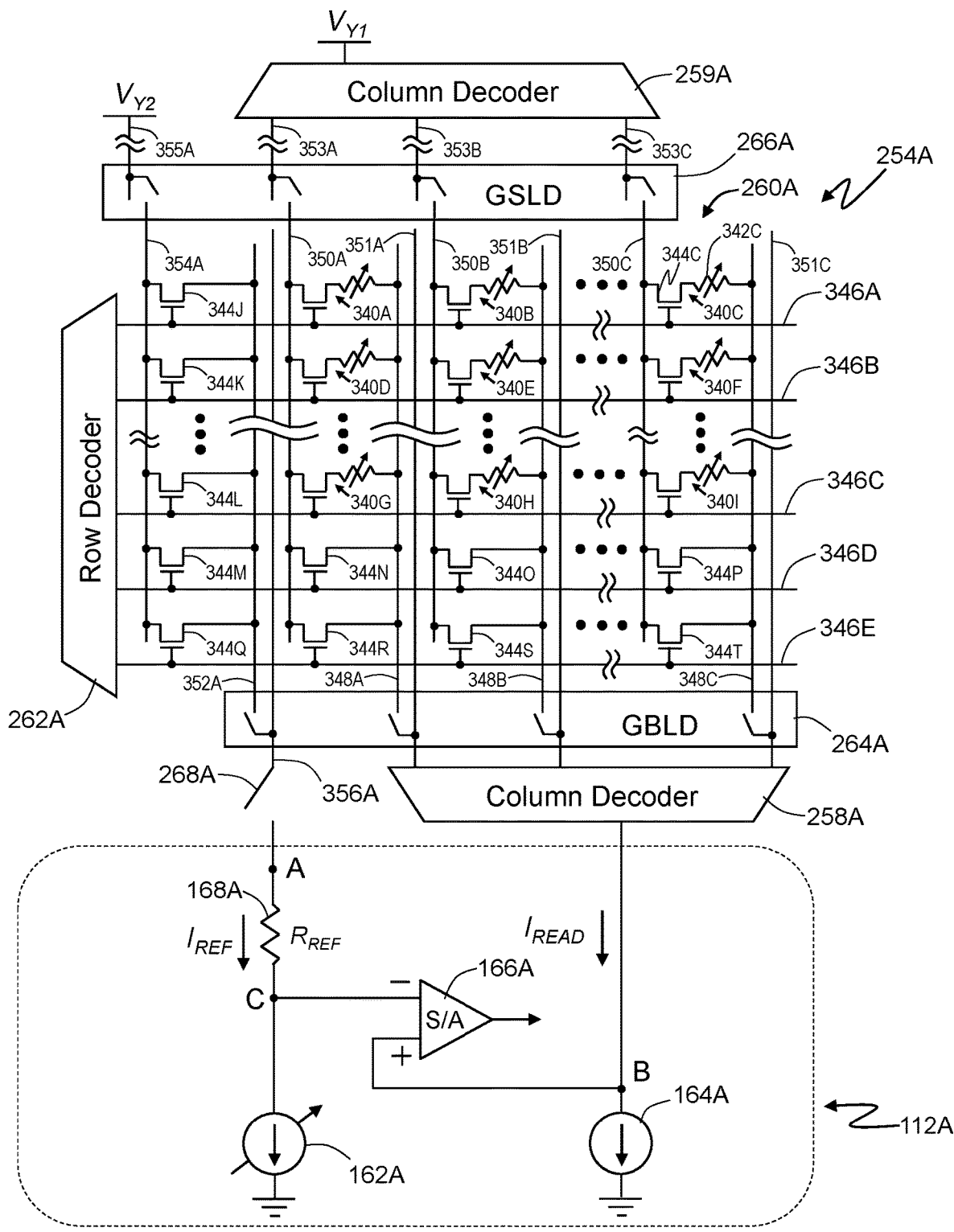
FIG. 10 is a schematic circuit diagram of a memory section and another exemplary read circuit of the memory device of FIG. 7.

FIG. 10 is schematic circuit diagram showing the memory sector 254A, the first column decoder 258A, the first switch 268A, another exemplary circuit for the read circuit 112A, the first plurality of global bit lines 351A-351C, the first plurality of global source lines 353A-353C, and the third column decoder 259A of the first memory slice 252A shown in FIG. 7. In the drawing, numerals 112A-166A and 254A-356A denote the same components or elements as those shown for the embodiment in FIG. 9. The memory sector 254A and the read circuit 112A shown in FIG. 10 are different from the previous embodiment in that the reference resistor ($R_{REF}$) 357A in the memory sector 254A, as shown in FIG. 9, is replaced by the reference resistor ($R_{REF}$) 168A in the read circuit 112A. This change effectively moves the reference resistor 357A from the memory sector 254A to the read circuit 112A along the reference current path, thereby allowing all memory sectors of the first and second plurality of memory sectors 254A-256A and 270A-272A connected to the read circuit 112A to share the same reference resistor 168A. Alternatively, the reference resistor ($R_{REF}$) 357A shown in FIG. 9 may be moved to a position between the global bit line decoder (GBLD) 264A and the first switch 268A, thereby allowing all memory sectors of the first plurality of memory sectors 254A and 256A to share the same reference resistor.

With continuing reference to FIG. 10, in a read operation, a reference voltage (e.g., $V_{READ}$) may be applied to the first global reference source line 355A, thereby causing a reference current ($I_{REF}$) to flow from the first global reference source line 355A through the global source line decoder (GSLD) 266A, the local reference source line 354A, one of the column of access transistors (e.g., 344J) connected to a selected word line (e.g., 346A), the local reference bit line 352A, the global bit line decoder (GBLD) 264A, the first global reference bit line 356A, and the first switch 268A, to Node A of the read circuit 112A. The reference current ($I_{REF}$) does not pass through any of the memory cells (340A-340I).

The read circuit 112A of FIG. 10 and operation thereof are substantially identical to the read circuit 112A and its operation shown in FIG. 6 and described above.

Figure 11:
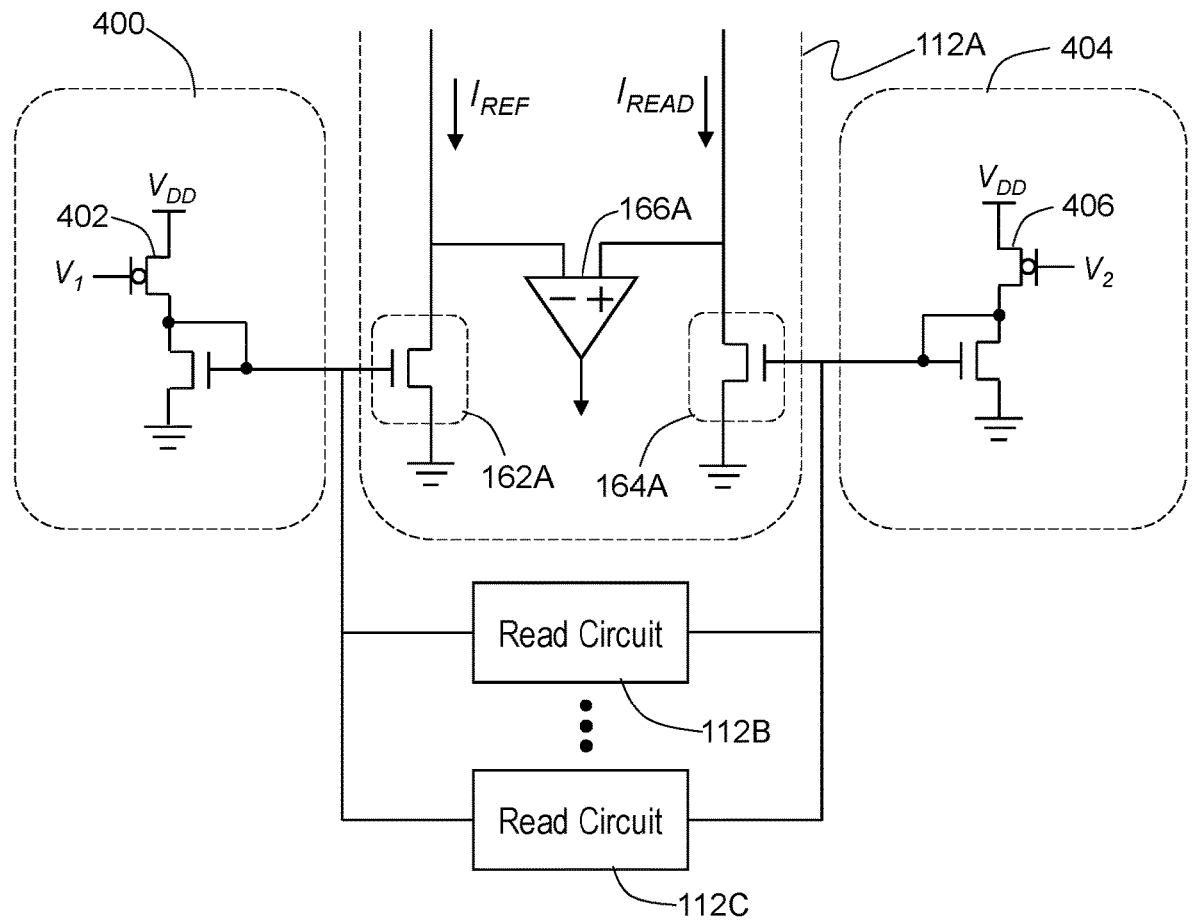
FIG. 11 is a schematic circuit diagram illustrating an exemplary embodiment of the first and second current sources of FIGS. 5-6 and 9-10.

FIG. 11 is a schematic circuit diagram illustrating an exemplary embodiment of the first and second current sources 162A and 164A of the read circuit 112A shown in FIGS. 5-6 and 9-10. The first current source 162A may comprise a transistor, which is connected to a first reference generator 400. The transistor 162A and the first reference generator 400 collectively form a current mirror circuit. The gate voltage $V_1$ of a transistor 402 of the first reference generator 400 may be varied to modulate the reference current ($I_{REF}$).

The second current source 164A may comprise a transistor, which is connected to a second reference generator 404. The transistor 164A and the second reference generator 404 collectively form a current mirror circuit. The gate voltage $V_2$ of a transistor 406 of the second reference generator 404 may be varied to modulate the read current ($I_{READ}$). In an embodiment, the gate voltage $V_1=k \cdot V_2$, where k is a multiplier that may be adjusted during operation to establish the optimal reference voltage at the negative input terminal of the sense amplifier 166A. The first and second reference generators 400 and 404 may be respectively connected to other first and second current sources in other read circuits 112B and 112C.

Figure 12:
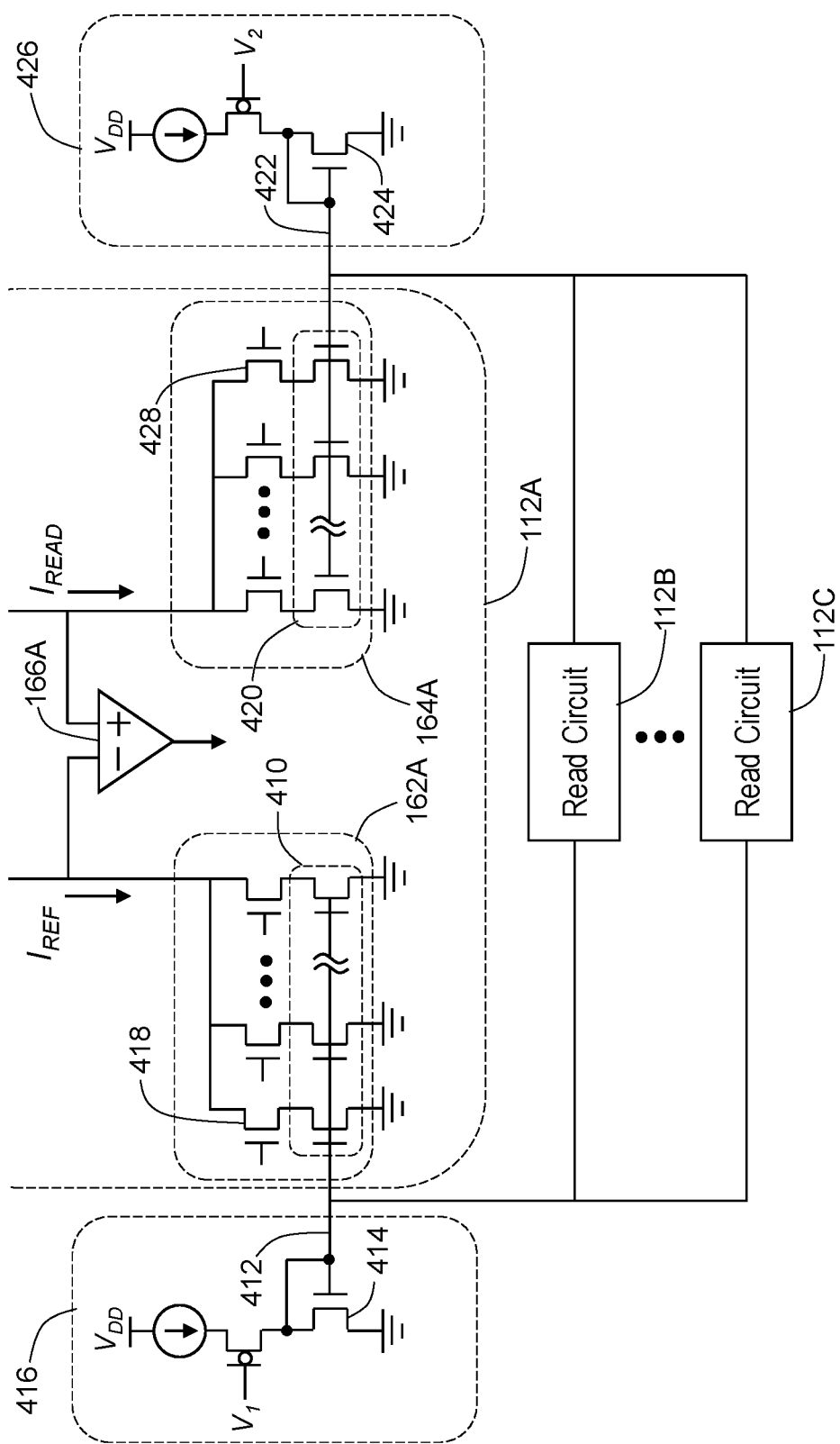
FIG. 12 is a schematic circuit diagram illustrating another exemplary embodiment of the first and second current sources of FIGS. 5-6 and 9-10.

FIG. 12 is a schematic circuit diagram illustrating another exemplary embodiment of the first and second current sources 162A and 164A of the read circuit 112A shown in FIGS. 5-6 and 9-10. The first current source 162A may comprise a first plurality of transistors 410 connected in parallel between ground and Node A of FIGS. 5 and 9 or Node C of FIGS. 6 and 10. The gates of the first plurality of transistors 410 are connected to a common conductive line 412, which is further connected to the gate of a reference transistor 414 of a first reference generator 416. The first plurality of transistors 410 and the first reference generator 416 collectively form a current mirror circuit. Each of the first plurality of transistors 410 is further connected to an access transistor 418 in series, thereby allowing the first plurality of transistors 410 to be individually controlled to modulate the reference current ($I_{REF}$) during operation.

The second current source 164A may comprise a second plurality of transistors 420 connected in parallel between ground and Node B of FIGS. 5-6 and 9-10. The gates of the second plurality of transistors 420 are connected to a common conductive line 422, which is further connected to the gate of a reference transistor 424 of a second reference generator 426. The second plurality of transistors 420 and the second reference generator 426 collectively form a current mirror circuit. Each of the second plurality of transistors 420 is further connected to an access transistor 428 in series, thereby allowing the second plurality of transistors 420 to be individually controlled. The first and second reference generators 416 and 426 may be respectively connected to first and second current sources of other read circuits 112B and 112C.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A nonvolatile memory device comprising a plurality of memory slices, each memory slice including one or more memory sectors and a read circuit for sensing a resistance state of a magnetic memory cell in said one or more memory sectors, said read circuit comprising:
   a first input node through which a reference current passes;
   a second input node through which a read current from said one or more memory sectors passes;

a sense amplifier configured to compare input voltages, said sense amplifier having first and second input terminals with said second input terminal connected to said second input node;
a reference resistor connected to said first input node at one end and said first input terminal of said sense amplifier at the other end;
a variable current source connected to said reference resistor at one end and ground at the other end; and
a second current source connected to said second input node at one end and ground at the other end,
wherein each of said one or more memory sectors includes a column of transistors, at least one row of transistors, and an array of magnetic memory cells arranged in rows and columns, each of said magnetic memory cells including an access transistor and a magnetic tunnel junction (MTJ) coupled in series between a respective one of a plurality of source lines and a respective one of a plurality of bit lines, each transistor of said at least one row of transistors being directly coupled to another respective one of said plurality of source lines at one of source and drain and another respective one of said plurality of bit lines at the other one of source and drain.

2. The nonvolatile memory device of claim 1, wherein said variable current source includes a plurality of transistors connected in parallel between said reference resistor and ground, gates of said plurality of transistors being connected to a common conductive line.

3. The nonvolatile memory device of claim 2, wherein said variable current source further includes a plurality of access transistors, each of said plurality of access transistors being coupled to a respective one of said plurality of transistors in series between said reference resistor and ground.

4. The nonvolatile memory device of claim 1, wherein said read current passes through one of said array of magnetic memory cells.

5. The nonvolatile memory device of claim 1, wherein said column of transistors are directly coupled to a reference source line at one of source and drain and a reference bit line at the other one of source and drain.

6. The nonvolatile memory device of claim 1, wherein said reference current passes through one of said column of transistors and bypasses said array of magnetic memory cells.

7. A nonvolatile memory device comprising a plurality of memory slices, each memory slice including one or more memory sectors and a read circuit for sensing a resistance state of a magnetic memory cell in said one or more memory sectors, said read circuit comprising:

a first input node through which a reference current passes;
a second input node through which a read current from said one or more memory sectors passes;
a sense amplifier configured to compare input voltages, said sense amplifier having first and second input terminals connected to said first and second input nodes, respectively;
a variable current source connected to said first input node at one end and ground at the other end; and
a second current source connected to said second input node at one end and ground at the other end,
wherein each of said one or more memory sectors includes a column of transistors, at least one row of transistors, and an array of magnetic memory cells arranged in rows and columns, each of said magnetic memory cells including an access transistor and a magnetic tunnel junction (MTJ) coupled in series between a respective one of a plurality of source lines and a respective one of a plurality of bit lines, each transistor of said at least one row of transistors is directly coupled to another respective one of said plurality of source lines at one of source and drain and another respective one of said plurality of bit lines at the other one of source and drain.

8. The nonvolatile memory device of claim 7, wherein said variable current source includes a plurality of transistors connected in parallel between said first input node and ground, gates of said plurality of transistors being connected to a common conductive line.

9. The nonvolatile memory device of claim 8, wherein said variable current source further includes a plurality of access transistors, each of said plurality of access transistors being coupled to a respective one of said plurality of transistors in series between said first input node and ground.

10. The nonvolatile memory device of claim 7, wherein said read current passes through one of said array of magnetic memory cells.

11. The nonvolatile memory device of claim 7, wherein said column of transistors are directly coupled to a reference source line at one of source and drain and a reference bit line at the other one of source and drain.

12. The nonvolatile memory device of claim 11, wherein said each of said one or more memory sectors further includes a reference resistor connected to said reference bit line at one end and said first input node of said read circuit at the other end.

13. The nonvolatile memory device of claim 12, wherein said reference current passes through one of said column of transistors and said reference resistor.

* * * * *